(12) United States Patent
Fang et al.

(10) Patent No.: US 7,651,876 B2
(45) Date of Patent: Jan. 26, 2010

(54) SEMICONDUCTOR STRUCTURES AND METHOD FOR FABRICATING THE SAME

(75) Inventors: Kuo-Lung Fang, Hsinchu (TW); Chih-Chun Yang, Hsinchu (TW); Han-Tu Lin, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 247 days.

(21) Appl. No.: 11/949,081

(22) Filed: Dec. 3, 2007

(65) Prior Publication Data

US 2008/0197372 A1 Aug. 21, 2008

(30) Foreign Application Priority Data

Feb. 16, 2007 (TW) .............................. 96106093 A

(51) Int. Cl.
H01L 21/00 (2006.01)
H01L 21/84 (2006.01)
H01L 21/44 (2006.01)

(52) U.S. Cl. .................. 438/22; 438/149; 438/153; 438/608

(58) Field of Classification Search .................. 438/29, 438/30, 153, 149, 110, 586, 151, 154, 22
See application file for complete search history.

(56) References Cited

U.S. PATENT DOCUMENTS

| | | | |
|---|---|---|---|
| 6,157,430 A * | 12/2000 | Kubota et al. ............... 349/147 |
| 6,335,148 B2 * | 1/2002 | Lee et al. ..................... 430/316 |
| 6,678,017 B1 * | 1/2004 | Shimomaki et al. ........... 349/40 |
| 6,995,050 B2 * | 2/2006 | Chen et al. ................... 438/154 |
| 7,126,157 B2 * | 10/2006 | Okada et al. .................. 257/59 |
| 7,309,625 B2 * | 12/2007 | Yen ............................. 438/149 |
| 7,402,470 B2 | 7/2008 | Lee |
| 7,459,723 B2 * | 12/2008 | Okada et al. .................. 257/59 |
| 7,563,656 B2 * | 7/2009 | Choung et al. .............. 438/149 |
| 2005/0001966 A1 | 1/2005 | Kim |
| 2005/0140858 A1 | 6/2005 | Park |

OTHER PUBLICATIONS

English Translation of Chinese Application Publication No. 1747171 Abstract. (Published Mar. 15, 2006).
CN Office Action mailed May 23, 2008.

* cited by examiner

*Primary Examiner*—Chuong A. Luu
(74) *Attorney, Agent, or Firm*—Thomas, Kayden, Horstemeyer & Risley

(57) ABSTRACT

A semiconductor structure is provided. The semiconductor structure includes a substrate, a gate disposed thereon, an insulation layer disposed on the substrate and overlying the gate, a patterned semiconductor layer disposed on the insulation layer, a source and a drain disposed on the patterned semiconductor layer, a protective layer overlying the insulation layer, the source and the boundary of the drain to expose a portion of the drain, and a pixel electrode disposed on the substrate, overlying the protective layer overlying the boundary of the drain, electrically connected to the exposed drain.

13 Claims, 16 Drawing Sheets

SEMICONDUCTOR STRUCTURES AND METHOD FOR FABRICATING THE SAME

BACKGROUND OF THE INVENTION

1. Field of the Invention

The invention relates to a semiconductor structure, and in particular to a semiconductor structure capable of formation of a continuous pixel electrode and a method for fabricating the same.

2. Description of the Related Art

A top view of a conventional semiconductor structure is shown in FIG. 1. FIG. 2A is a cross-section along A-A' line of FIG. 1. A conventional fabrication method of a semiconductor structure is shown in FIGS. 2A~2D.

Referring to FIGS. 1 and 2A, a substrate 1 is provided. A first metal line 2 is then formed on the substrate 1. The first metal line 2 may be gate line or common line. Next, an insulation layer 3 is formed on the substrate 1, overlying the first metal line 2. A semiconductor layer 4 is then formed on the insulation layer 3. Next, a second metal line 5 is formed on the semiconductor layer 4. A protective layer 6 is then formed on the second metal line 5. Next, a photoresist layer 7 is formed on the protective layer 6, overlying the first metal line 2 and exposing a portion of the insulation layer 3, the semiconductor layer 4, the second metal line 5 and the protective layer 6.

Referring to FIG. 2B, the protective layer 6, the second metal line 5, the semiconductor layer 4 and the insulation layer 3 are then etched using the photoresist layer 7 as a mask, exposing the substrate 1. The etching rate of the insulation layer 3 is faster than that of the semiconductor layer 4 due to various materials therebetween, resulting in non-continuity, shown as under cut 8.

After removal of a portion of the photoresist layer 7, as shown in FIG. 2C, an indium tin oxide electrode 9 is deposited on the photoresist layer 7, the protective layer 6, the second metal line 5, the semiconductor layer 4 and the substrate 1, as shown in FIG. 2D. However, the indium tin oxide electrode 9 deposited on the substrate 1 is discontinuous with that deposited on other layers because of the undercut, resulting in electrode break 10.

BRIEF SUMMARY OF THE INVENTION

In one aspect, the invention provides a semiconductor structure comprising a substrate, a gate disposed thereon, an insulation layer disposed on the substrate and overlying the gate, a patterned semiconductor layer disposed on the insulation layer, a source and a drain disposed on the patterned semiconductor layer, a protective layer overlying the insulation layer, the source and the boundary of the drain to expose a portion of the drain, and a pixel electrode disposed on the substrate and overlying the protective layer overlying the boundary of the drain, electrically connected to the exposed drain.

In another aspect, the invention also provides a method for fabricating a semiconductor structure, in which a substrate is provided. An active device comprising a drain is formed on the substrate. A protective layer is formed on the substrate, overlying the active device. A photoresist layer is formed on the protective layer. The photoresist layer has a first thickness and a second thickness, wherein the first thickness exceeds the second thickness and the photoresist layer of the second thickness overlies the boundary of the drain. The protective layer is defined using the photoresist layer as a mask to expose the substrate and a portion of the drain. The photoresist layer of the second thickness is removed, leaving the protective layer overlying the boundary of the drain. A transparent conductive layer is deposited on the substrate, overlying the protective layer overlying the boundary of the drain, electrically connected to the exposed drain. The remaining photoresist layer and the transparent conductive layer formed thereon are removed to form a pixel electrode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
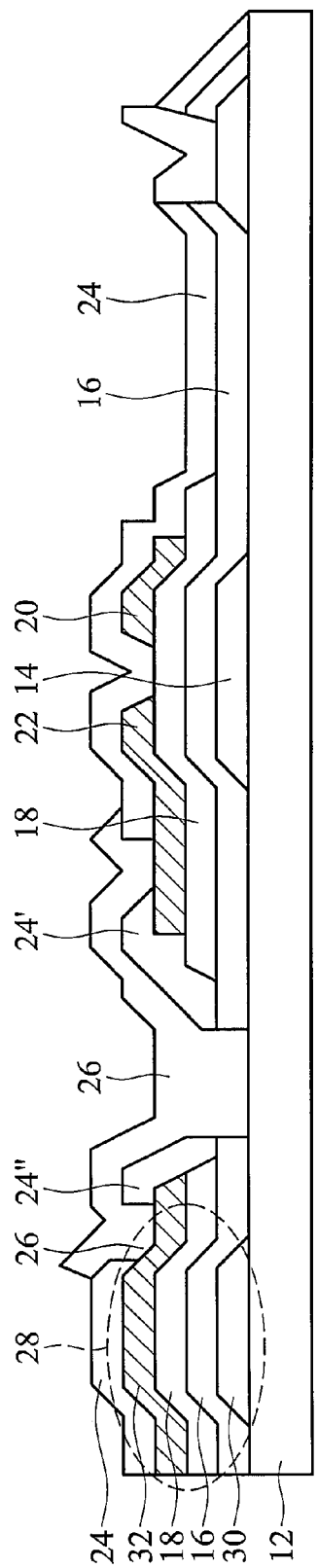
FIG. 3 is a cross section of a semiconductor structure of the invention.

FIG. 3 is a cross section of one embodiment of a semiconductor structure. The semiconductor structure 10 comprises a substrate 12, a gate 14, an insulation layer 16, a patterned semiconductor layer 18, a source 20, a drain 22, a protective layer 24 and a pixel electrode 26. The substrate 12 may be a glass substrate. The insulation layer 16 and the protective layer 24 may comprise silicon oxide, silicon nitride or silicon oxynitride.

The gate 14 is disposed on the substrate 12. The insulation layer 16 is disposed on the substrate 12 and overlies the gate 14. The patterned semiconductor layer 18 is disposed on the insulation layer 16. The source 20 and the drain 22 are disposed on the patterned semiconductor layer 18. The protective layer (24 and 24') overlies the insulation layer 16, the source 20 and the boundary of the drain 22, exposing a portion of the drain 22. The pixel electrode 26 is disposed on the substrate 12 and overlies the protective layer 24' overlying the boundary of the drain 22, electrically connected to the exposed drain 22.

The patterned semiconductor layer 18 comprises a channel layer (not shown) and an ohmic contact layer (not shown) contacting the source 20 and the drain 22. The semiconductor structure 10 further comprises a capacitor 28 disposed on the substrate 12. The capacitor 28 may comprise a first metal line 30, the insulation layer 16, a second metal line 32 and the pixel electrode 26. The first metal line 30 may be a gate line or common line. In this figure, the patterned semiconductor layer 18 is further disposed between the insulation layer 16 and the second metal line 32. The protective layer 24" further overlies the boundary of the second metal line 32, exposing a portion of the second metal line 32. The pixel electrode 26 further overlies the protective layer 24" overlying the boundary of the second metal line 32, electrically connected to the exposed second metal line 32.

Figure 4:
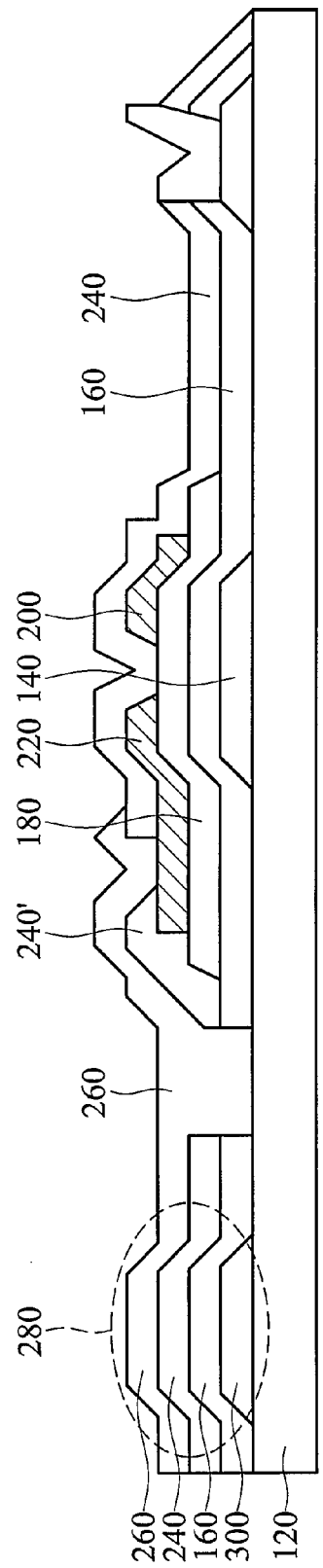
FIG. 4 is a cross section of a semiconductor structure of the invention.

FIG. 4 is a cross section of another embodiment of a semiconductor structure. The semiconductor structure 100 comprises a substrate 120, a gate 140, an insulation layer 160, a patterned semiconductor layer 180, a source 200, a drain 220, a protective layer 240 and a pixel electrode 260. The substrate 120 may be a glass substrate. The insulation layer 160 and the protective layer 240 may comprise silicon oxide, silicon nitride or silicon oxynitride.

The gate 140 is disposed on the substrate 120. The insulation layer 160 is disposed on the substrate 120 and overlies the gate 140. The patterned semiconductor layer 180 is disposed on the insulation layer 160. The source 200 and the drain 220 are disposed on the patterned semiconductor layer 180. The protective layer (240 and 240') overlies the insulation layer 160, the source 200 and the boundary of the drain 220, exposing a portion of the drain 220. The pixel electrode 260 is disposed on the substrate 120 and overlies the protective layer 240' overlying the boundary of the drain 220, electrically connected to the exposed drain 220.

The patterned semiconductor layer 180 comprises a channel layer (not shown) and an ohmic contact layer (not shown) contacting the source 200 and the drain 220. The semiconductor structure 100 further comprises a capacitor 280 disposed on the substrate 120. The capacitor 280 may comprise a first metal line 300, the insulation layer 160 and the pixel electrode 260. The first metal line 300 may be a gate line or common line. In this figure, the protective layer 240 is further formed between the insulation layer 160 and the pixel electrode 260 of the capacitor 280.

Figure 5A:
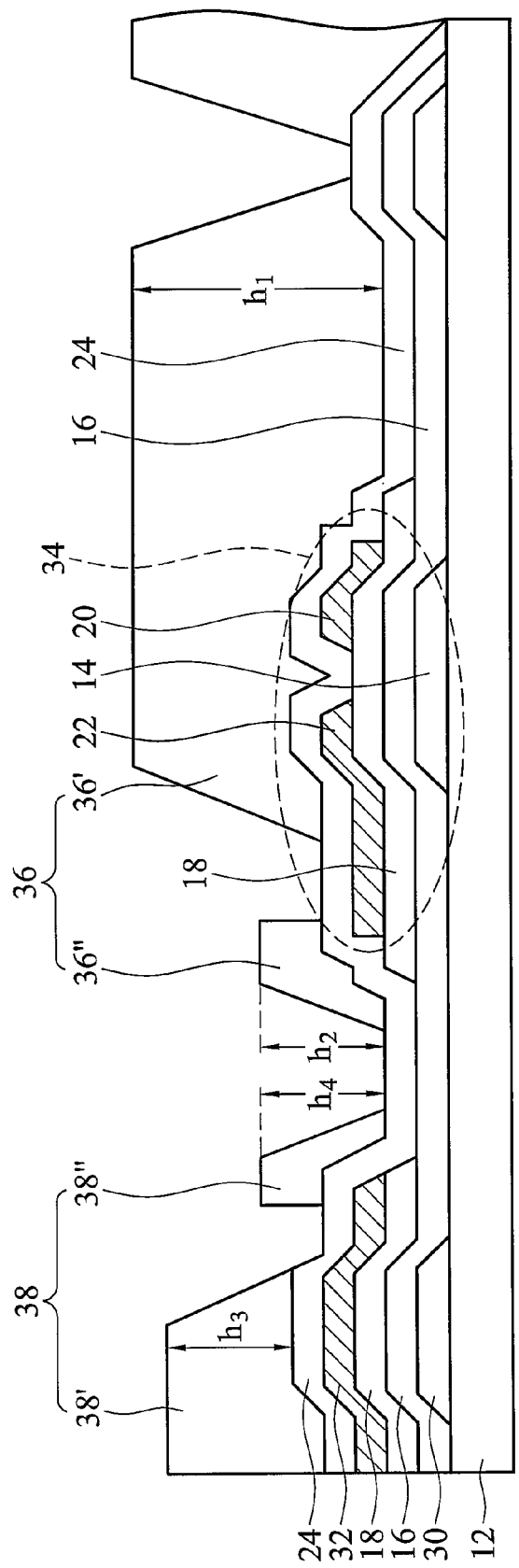
FIGS. 5A~5E are cross sections illustrating a method for fabricating a semiconductor structure of the invention.
Figure 5B:
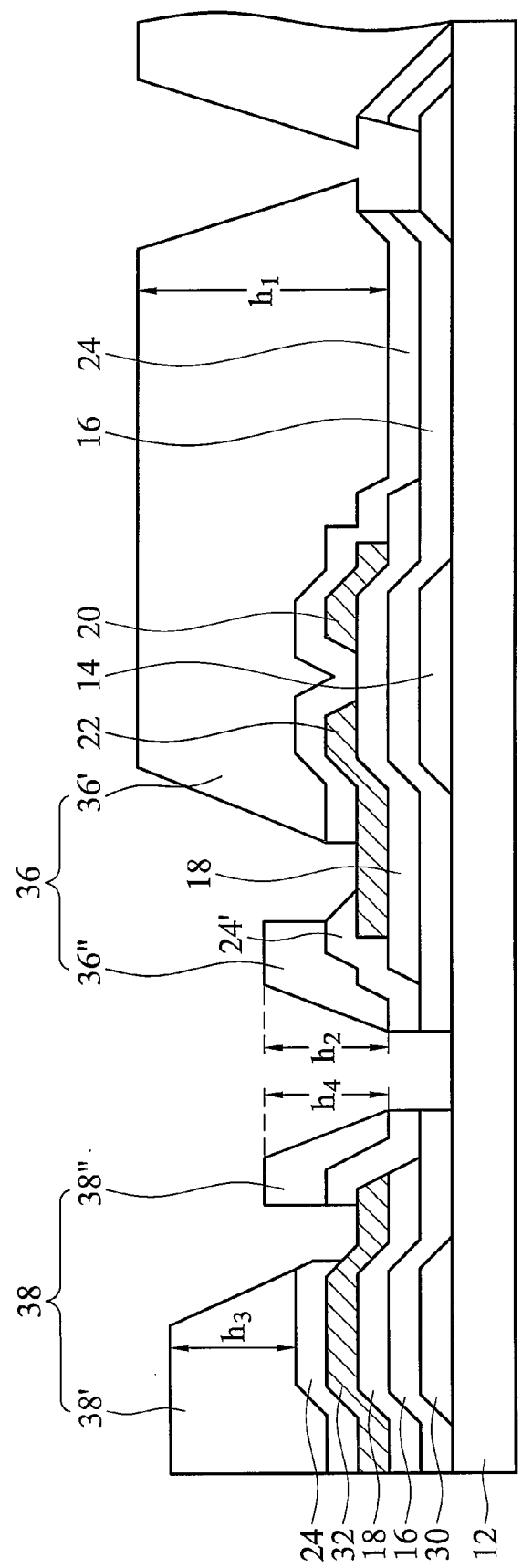

A fabrication method of a semiconductor structure of the invention is shown in FIGS. 5A~5E. Referring to FIG. 5A, a substrate 12 is provided. An active device 34 comprising a drain 22 is then formed on the substrate 12. Next, a protective layer 24 is formed on the substrate 12, overlying the active device 34. A photoresist layer 36 is then formed on the protective layer 24. The photoresist layer 36 has a first thickness h1 and a second thickness h2, the first thickness h1 exceeding the second thickness h2. The photoresist layer 36" of the second thickness h2 overlies the boundary of the drain 22. Next, the protective layer 24 is defined using the photoresist layer 36 as a mask to expose the substrate 12 and a portion of the drain 22, as shown in FIG. 5B. A top view of the active device area of FIG. 5B is shown in FIG. 6 (the active device area of FIG. 5B is a cross section along A-A' line of FIG. 6). Indeed, the photoresist layer 36" of the second thickness h2 overlies the boundary of the drain 22 according to FIG. 6.

Figure 5C:
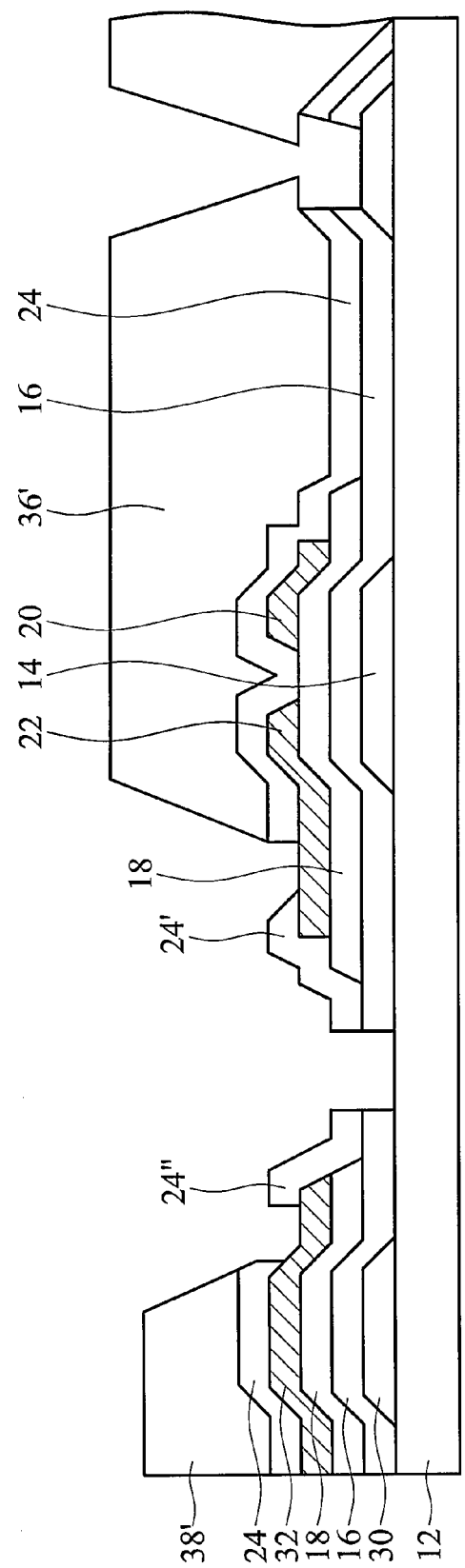
Figure 6:
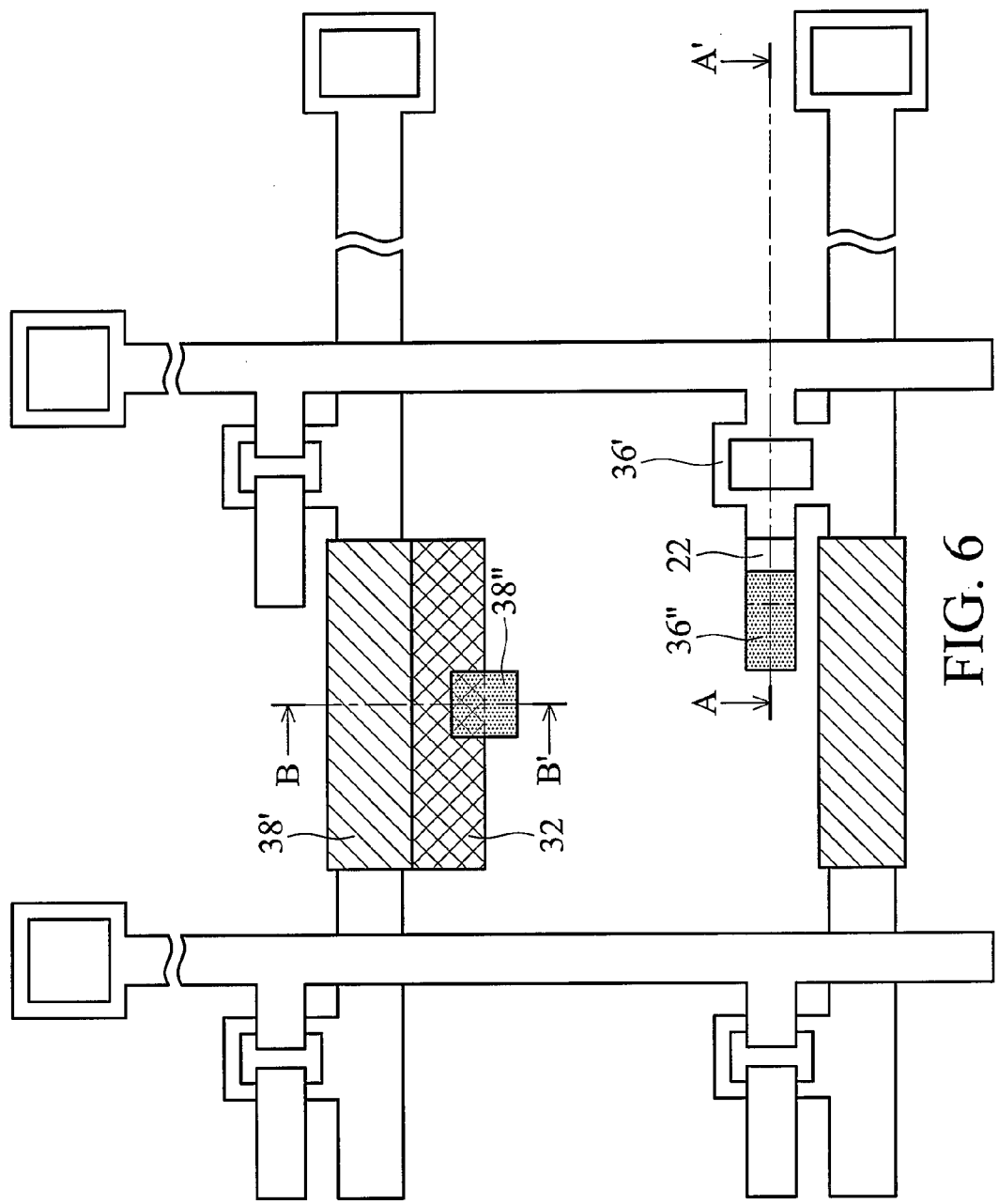
FIG. 6 is a top view of FIG. 5B.

After removal of the photoresist layer 36" of the second thickness h2, the protective layer 24' overlying the boundary of the drain 22 remains, as shown in FIG. 5C.

Figure 5D:
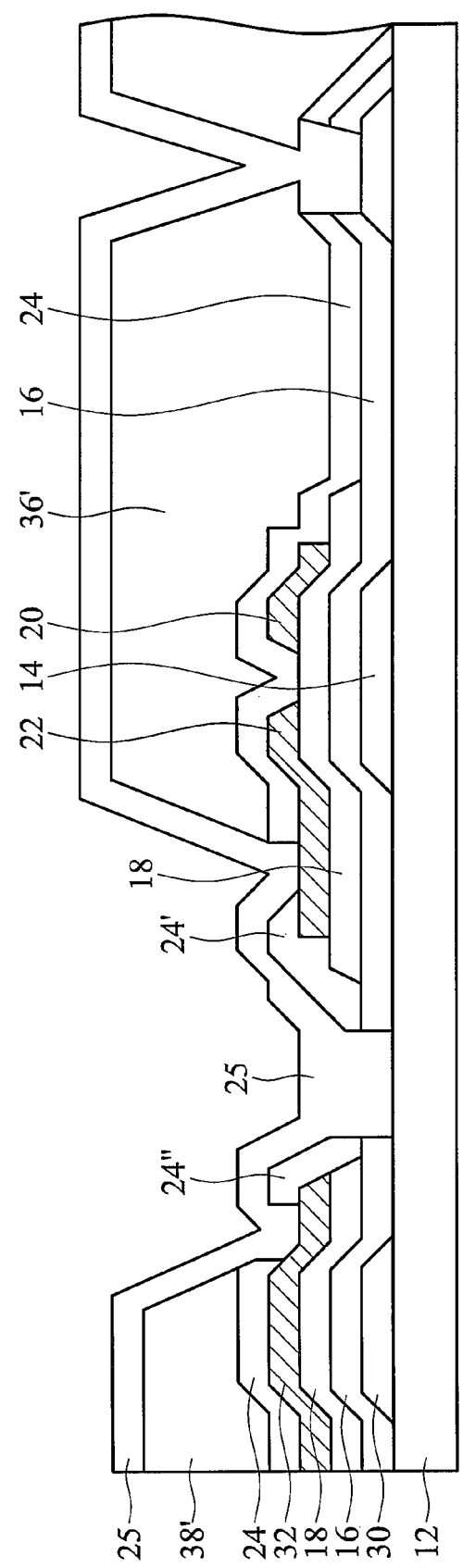

Referring to FIG. 5D, a transparent conductive layer 25 is deposited on the substrate 12, overlying the protective layer 24' overlying the boundary of the drain 22, electrically connected to the exposed drain 22.

Figure 5E:
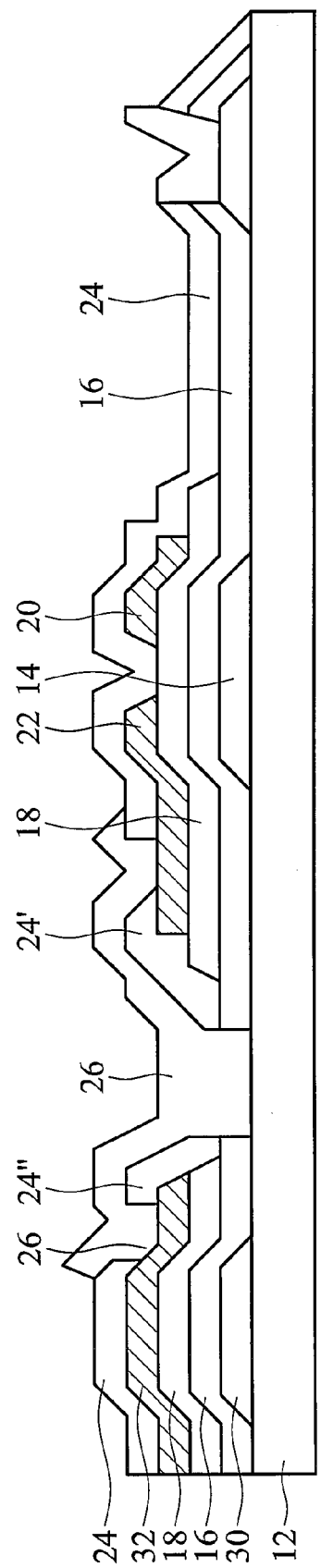

Referring to FIG. 5E, the remaining photoresist layer 36' and the transparent conductive layer 25 formed thereon are removed to form a pixel electrode 26.

FIG. 5A shows a method for forming the active device 34. A gate 14 is formed on the substrate 12. An insulation layer 16 is then formed on the substrate 12, overlying the gate 14. Next, a patterned semiconductor layer 18 is formed on the insulation layer 16. A source 20 and a drain 22 are then formed on the patterned semiconductor layer 18 at both sides of the gate 14. Formation of gate 14 further comprises forming a first metal layer (not shown) on the substrate 12 and patterning the first metal layer to form the gate 14.

Formation of the patterned semiconductor layer 18, the source 20 and the drain 22 further comprises forming a semiconductor layer (not shown) on the insulation layer 16, forming a second metal layer (not shown) on the semiconductor layer, forming a photoresist layer (not shown) on the second metal layer, defining the semiconductor layer and the second metal layer using the photoresist layer as a mask and forming the patterned semiconductor layer 18, the source 20 and the drain 22 after removal of the photoresist layer. The photoresist layer has two thicknesses, wherein the thicker photoresist layer overlies the second metal layer, a predetermined area of the source 20 and the drain 22.

The method of fabricating the semiconductor structure of the invention further comprises forming a capacitor on the substrate, as shown in FIGS. 5A, 5C and 5E. Referring to FIG. 5A, a first metal line 30 is formed on the substrate 12. Next, the insulation layer 16 overlies the first metal line 30. A second metal line 32 is then formed on the insulation layer 16. Next, the protective layer 24 is formed on the second metal line 32. The protective layer 24 is then defined using a half-tone or gray-tone mask to leave the protective layer 24" overlying the boundary of the second metal line 32, exposing a portion of the second metal line 32, as shown in FIG. 5C.

Referring to FIG. 5E, the pixel electrode 26 overlies the protective layer 24" overlying the boundary of the second metal line 32, electrically connected to the exposed second metal line 32.

Figure 1:
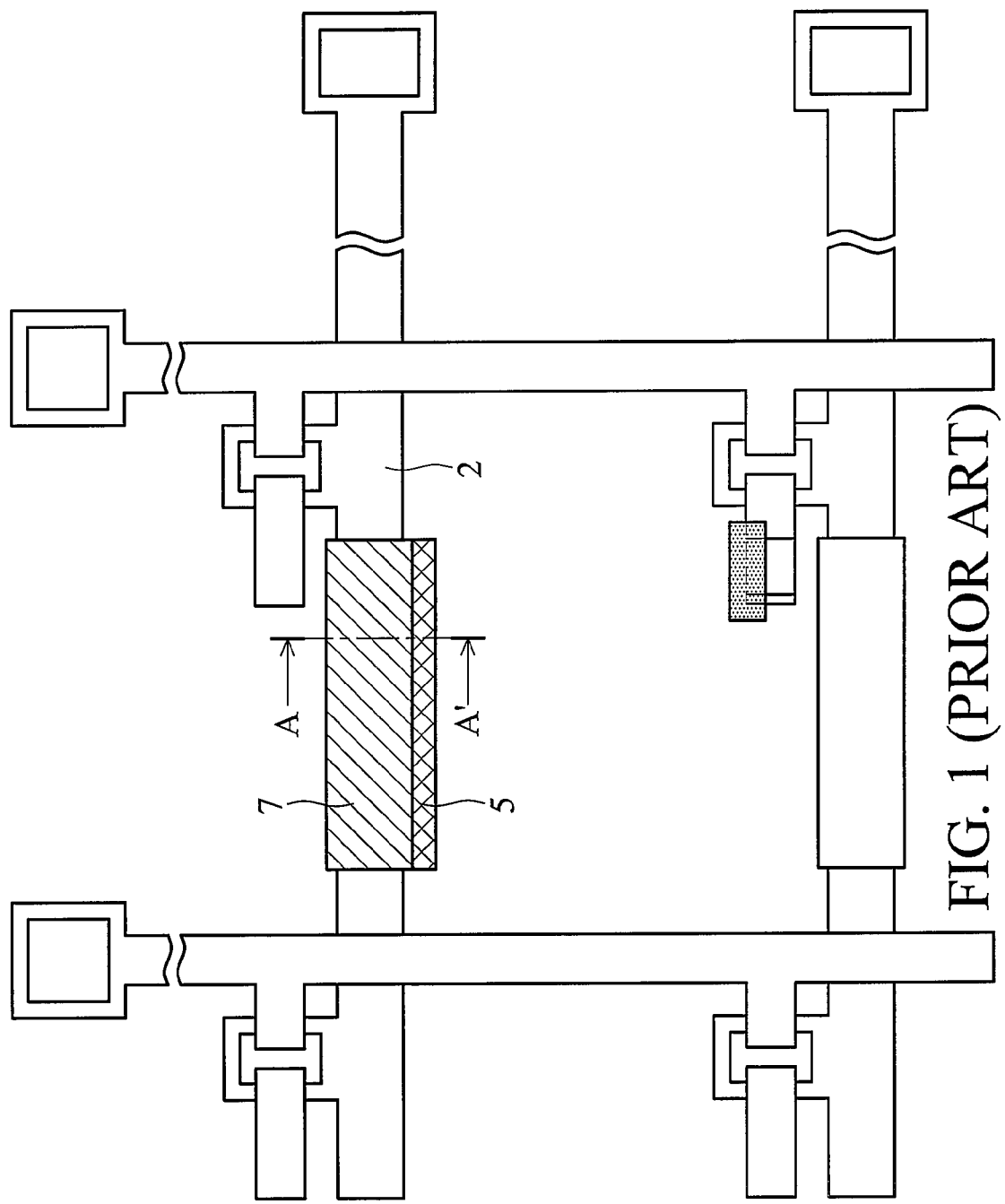
FIG. 1 is a top view of a conventional semiconductor structure.
Figure 2B:
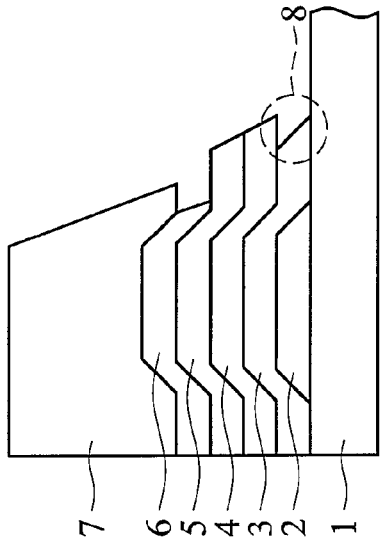
FIGS. 2A~2D are cross sections illustrating a method for fabricating a conventional semiconductor structure.
Figure 2D:
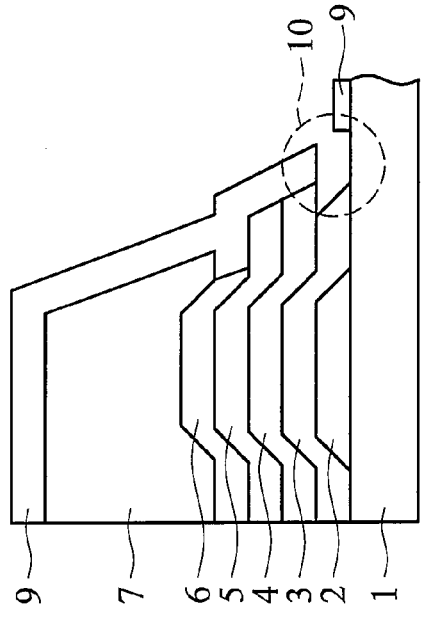
Figure 2A:
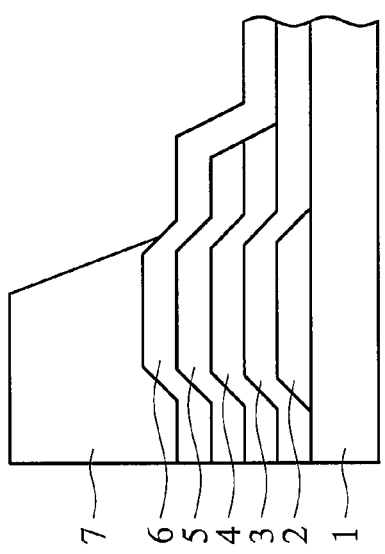
Figure 2C:
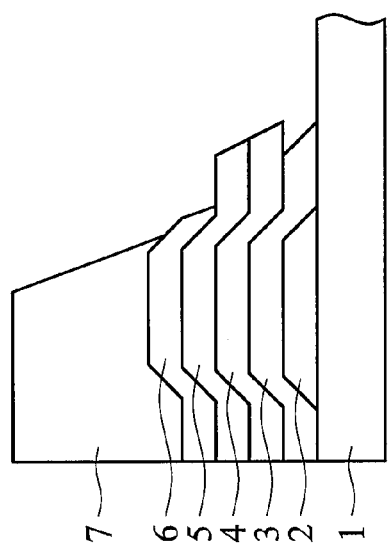

Definition of the protective layer overlying the second metal line using the half-tone or gray-tone mask is illustrated in FIGS. 5A~5E. Referring to FIG. 5A, a photoresist layer 38 is formed on the protective layer 24 overlying the second metal line 32. The photoresist layer 38 has a third thickness h3 and a fourth thickness h4, the third thickness h3 exceeding the fourth thickness h4. The photoresist layer 38" of the fourth thickness h4 overlies the boundary of the second metal line 32. Next, the protective layer 24 is defined using the photoresist layer 38 as a mask to expose a portion of the second metal line 32, as shown in FIG. 5B. A top view of the capacitor area of FIG. 5B is shown in FIG. 6 (the capacitor area of FIG. 5B is a cross section along B-B' line of FIG. 6). Indeed, the photoresist layer 38" of the fourth thickness h4 overlies the boundary of the second metal line 32 according to FIG. 6. The photoresist layer of FIG. 6 has two thicknesses and the thinner photoresist layer 38" is located at the boundary of the second metal line 32. The photoresist layer 7 of FIG. 1, however, has only one thickness and no photoresist layer at the boundary of the second metal line 5. Additionally, the photoresist layer 38" is located at the center of the boundary of the second metal line 32, but is not limited thereto, for example, the photoresist layer 38" may be located at the right side or left side of the boundary of the second metal line 32.

After removal of the photoresist layer 38" of the fourth thickness h4, the protective layer 24" overlying the boundary of the second metal line 32 remains, as shown in FIG. 5C.

Referring to FIG. 5D, the transparent conductive layer 25 is deposited on the remaining photoresist layer 38', overlying the protective layer 24" overlying the boundary of the second metal line 32, electrically connected to the exposed second metal line 32.

Referring to FIG. 5E, the remaining photoresist layer 38' and the transparent conductive layer 25 formed thereon are removed.

The first metal line 30, for example, a gate line or common line may be simultaneously formed with the gate 14. The second metal line 32 may be simultaneously formed with the source 20 and the drain 22.

Formation of the capacitor 28 on the substrate 12 further comprises forming the patterned semiconductor layer 18 between the insulation layer 16 and the second metal line 32.

Figure 7A:
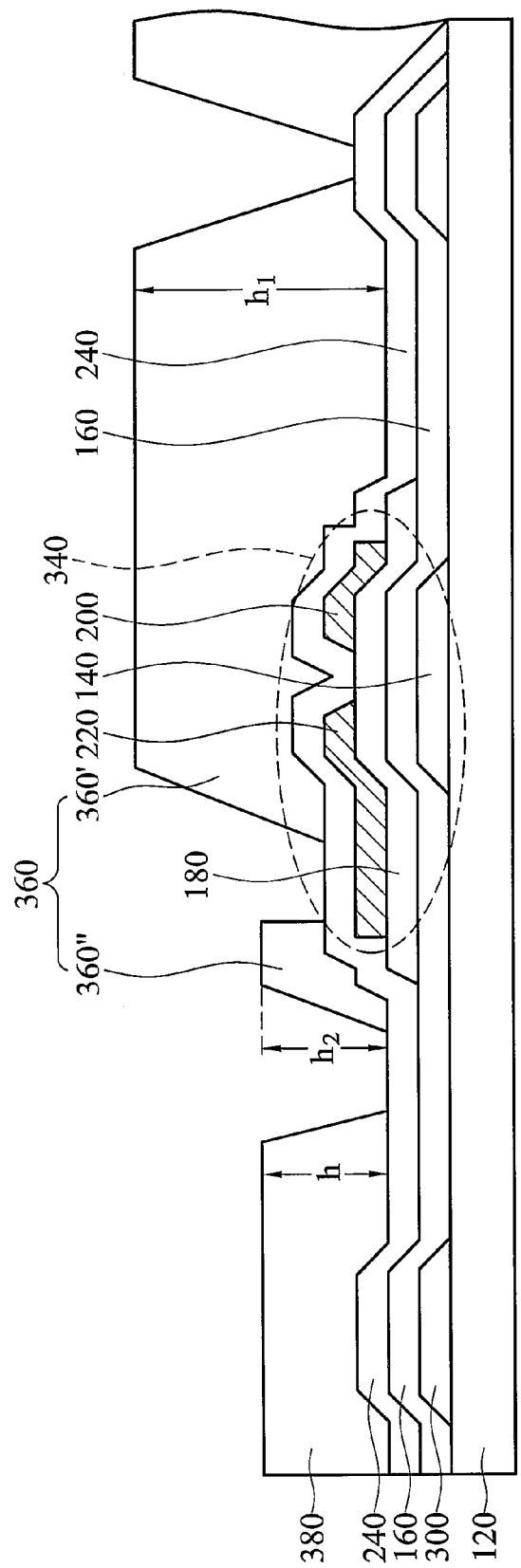
FIGS. 7A~7E are cross sections illustrating a method for fabricating a semiconductor structure of the invention.
Figure 7B:
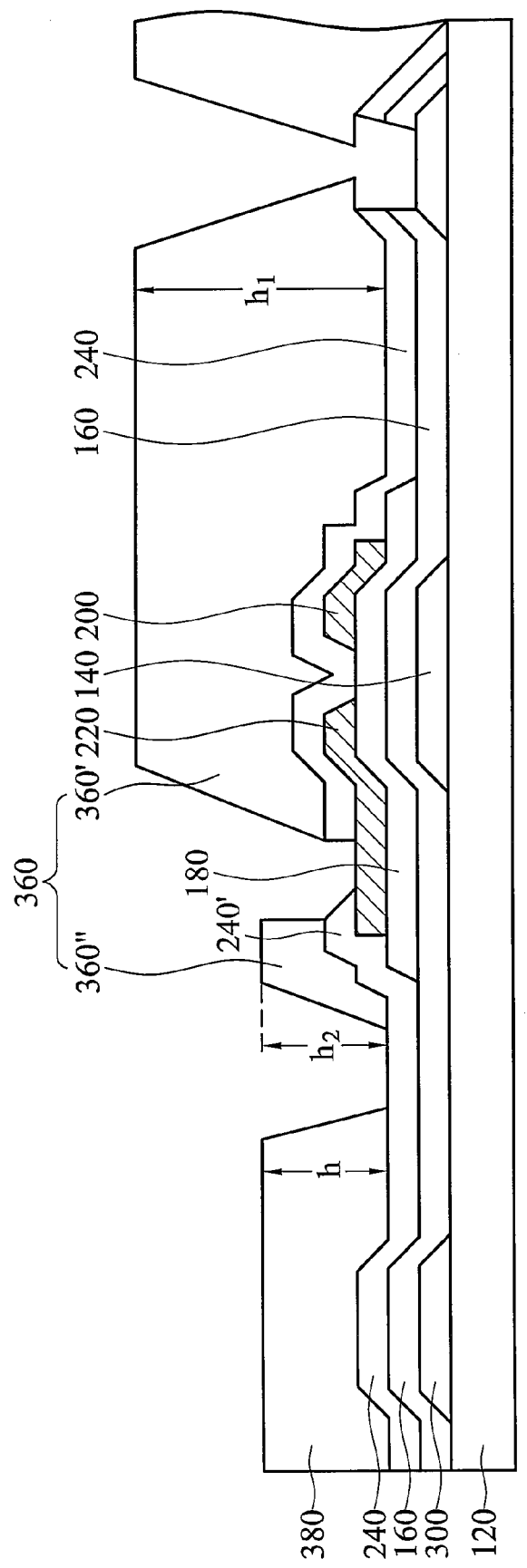
Figure 8:
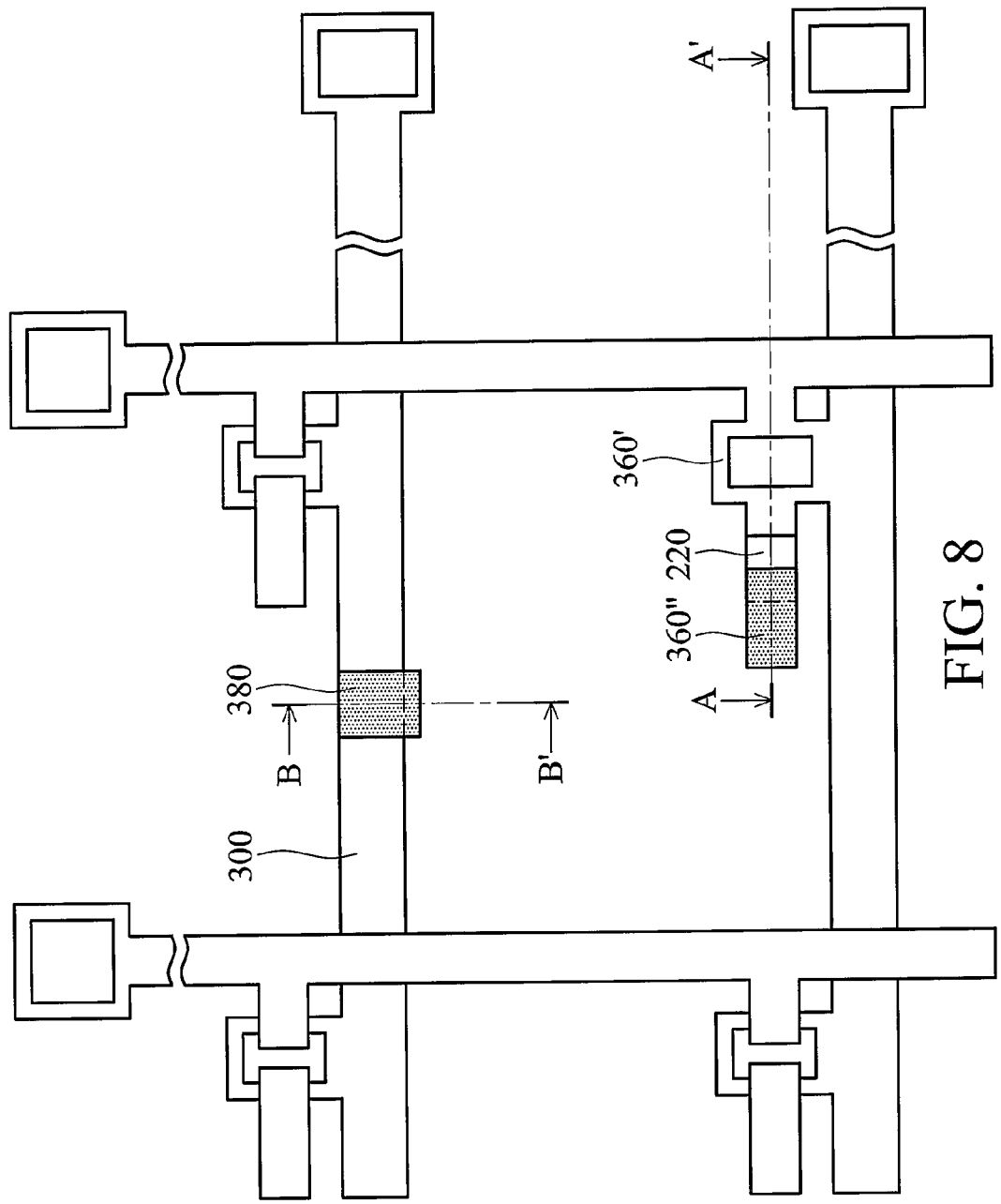
FIG. 8 is a top view of FIGS. 7A and 7B.
Figure 9B:
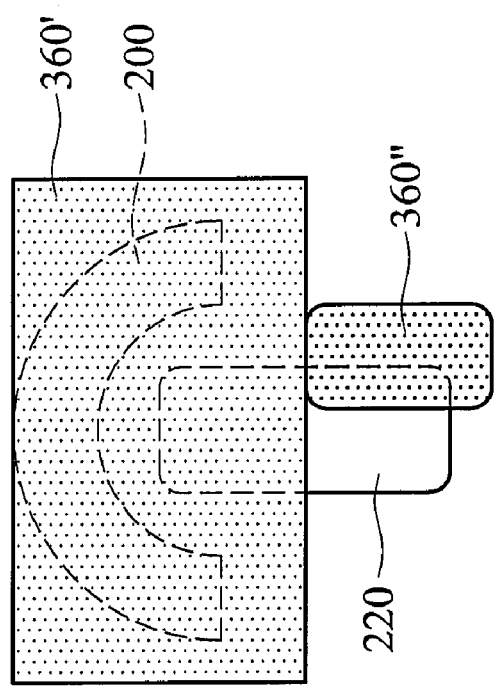
FIGS. 9A and 9B are photoresist layer configurations of the invention.
Figure 9A:
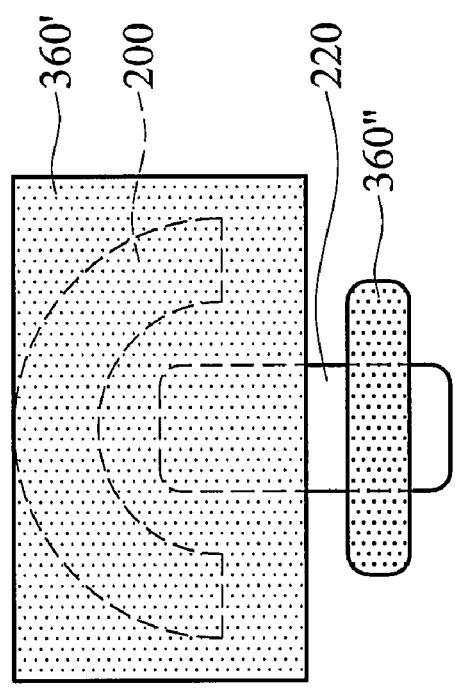

A fabrication method of a semiconductor structure of the invention is shown in FIGS. 7A~7E. Referring to FIG. 7A, a substrate 120 is provided. An active device 340 comprising a drain 220 is then formed on the substrate 120. Next, a protective layer 240 is formed on the substrate 120, overlying the active device 340. A photoresist layer 360 is then formed on the protective layer 240. The photoresist layer 360 has a first thickness h1 and a second thickness h2, the first thickness h1 exceeding the second thickness h2. The photoresist layer 360" of the second thickness h2 overlies the boundary of the drain 220. Next, the protective layer 240 is defined using the photoresist layer 360 as a mask to expose the substrate 120 and a portion of the drain 220, as shown in FIG. 7B. A top view of the active device area of FIG. 7B is shown in FIG. 8 (the active device area of FIG. 7B is a cross section along A-A' line of FIG. 8). Indeed, the photoresist layer 360" of the second thickness h2 overlies the boundary of the drain 220 according to FIG. 8. Various photoresist layer configurations across the boundary of the drain 220 of the invention are shown in FIGS. 9A and 9B.

Figure 7C:
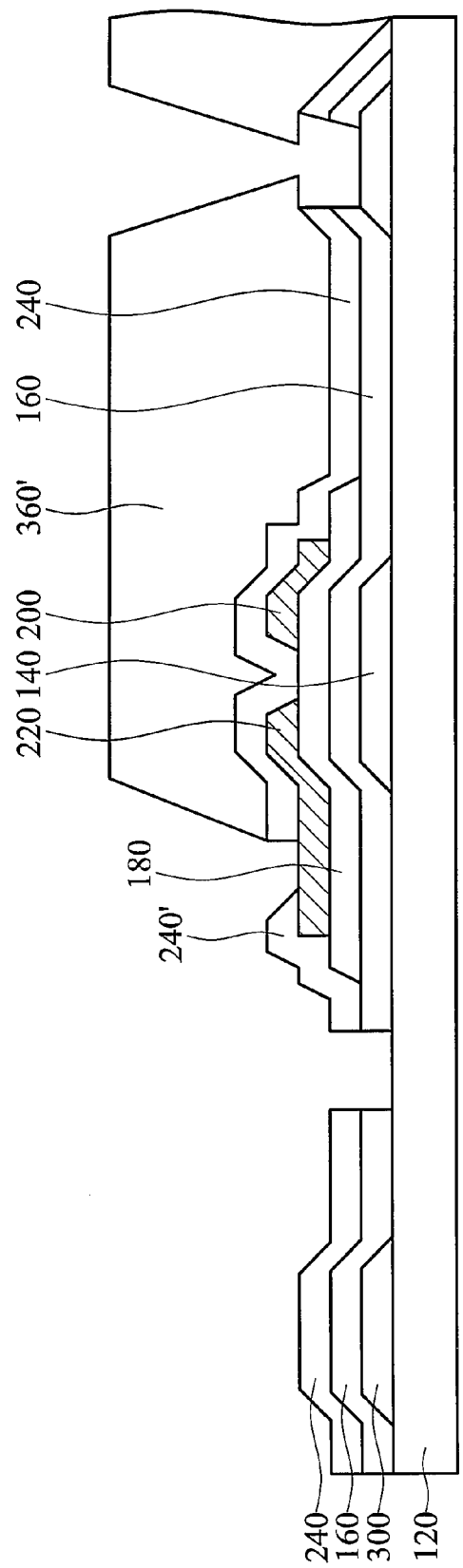

After removal of the photoresist layer 360" of the second thickness h2, the protective layer 240' overlying the boundary of the drain 220 remains, as shown in FIG. 7C.

Figure 7D:
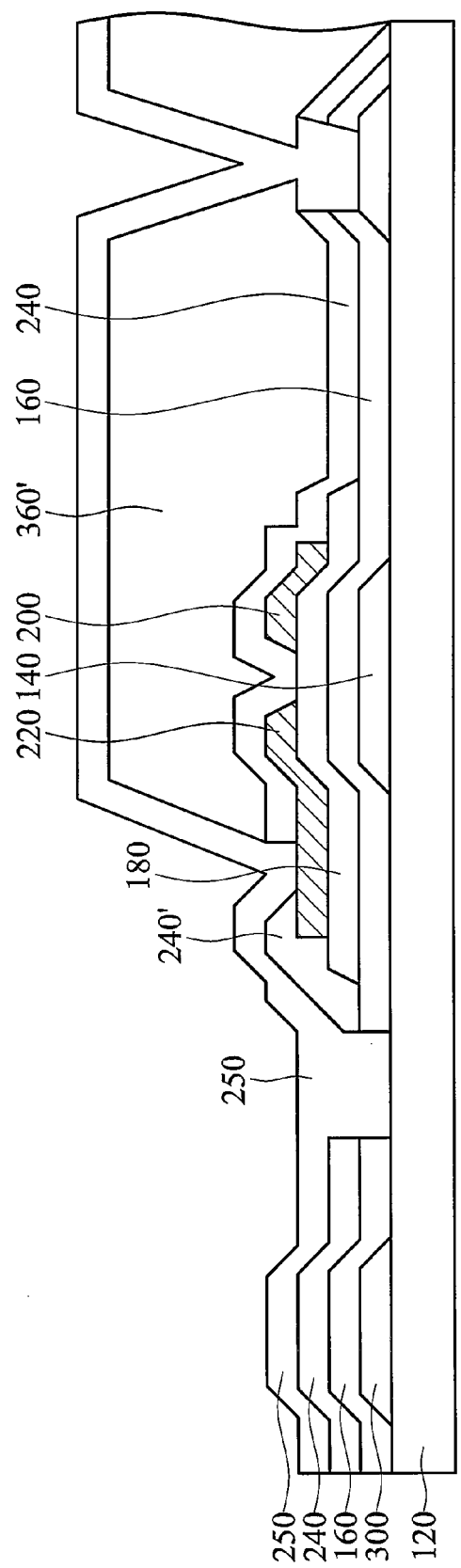

Referring to FIG. 7D, a transparent conductive layer 250 is deposited on the substrate 120, overlying the protective layer 240' overlying the boundary of the drain 220, electrically connected to the exposed drain 220.

Figure 7E:
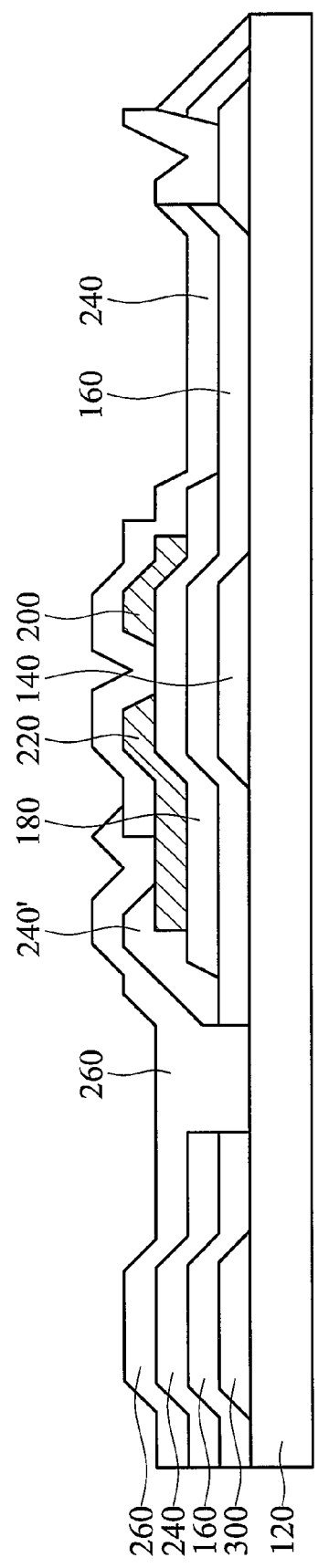

Referring to FIG. 7E, the remaining photoresist layer 360' and the transparent conductive layer 250 formed thereon are removed to form a pixel electrode 260.

FIG. 7A shows formation of the active device 340. A gate 140 is formed on the substrate 120. An insulation layer 160 is then formed on the substrate 120, overlying the gate 140. Next, a patterned semiconductor layer 180 is formed on the insulation layer 160. A source 200 and a drain 220 are then formed on the patterned semiconductor layer 180 on both sides of the gate 140. Formation of the gate 140 further comprise forming a first metal layer (not shown) on the substrate 120 and patterning the first metal layer to form the gate 140.

Additionally, formation of the patterned semiconductor layer 180, the source 200 and the drain 220 further comprises forming a semiconductor layer (not shown) on the insulation layer 160, forming a second metal layer (not shown) on the semiconductor layer, forming a photoresist layer (not shown) on the second metal layer, defining the semiconductor layer and the second metal layer using the photoresist layer as a mask and forming the patterned semiconductor layer 180, the source 200 and the drain 220 after removal of the photoresist layer. The photoresist layer has two thicknesses, wherein the thicker photoresist layer overlies the second metal layer, a predetermined area of the source 200 and the drain 220.

The method of fabricating the semiconductor structure of the invention further comprises forming a capacitor on the substrate, as shown in FIGS. 7A, 7C and 7E. Referring to FIG. 7A, a first metal line 300 is formed on the substrate 120. Next, the insulation layer 160 overlies the first metal line 300. The protective layer 240 is then formed on the insulation layer 160. Next, the protective layer 240 is defined using a half-tone or gray-tone mask to leave the protective layer 240 overlying the boundary of the first metal line 300, as shown in FIG. 7C.

Referring to FIG. 7E, the pixel electrode 260 overlies the protective layer 240.

Definition of the protective layer to leave the portions thereof overlying the boundary of the first metal line using the half-tone or gray-tone mask is shown in FIGS. 7A, 7C and 7D. Referring to FIG. 7A, a photoresist layer 380 is formed on the protective layer 240 overlying the insulation layer 160. The photoresist layer 380 has a thickness h equal to the second thickness h2. The photoresist layer 380 overlies the boundary of the first metal line 300. A top view of the capacitor area of FIG. 7A is shown in FIG. 8 (the capacitor area of FIG. 7A is a cross section along B-B' line of FIG. 8). Indeed, the photoresist layer 380 with the thickness h overlies the boundary of the first metal line 300 according to FIG. 8.

After removal of the photoresist layer 380, the protective layer 240 overlying the boundary of the first metal line 300 remains, as shown in FIG. 7C.

Referring to FIG. 7D, the transparent conductive layer 250 is deposited on the protective layer 240.

The first metal line 300 may be, for example, a gate line or common line.

The steps of the photolithography process are reduced from four or five to three using the disclosed photoresist layer with various thicknesses, improving yields and reducing cost. The metal-insulator-metal (MIM) capacitors and metal-insulator-ITO (MII) capacitors are compatible with the disclosed fabrication method. Specifically, undercutting is avoided by adjustment of photoresist layer thickness and disposition of photoresist layer on the protective layer overlying the boundary of the drain or metal line. Additionally, only a small-area half-tone or gray-tone mask is required, reducing cost.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor structure, comprising:

providing a substrate;

forming an active device comprising a drain having a boundary on the substrate;

forming a protective layer on the substrate, overlying the active device;

forming a photoresist layer having a first thickness and a second thickness on the protective layer, wherein the first thickness exceeds the second thickness and the photoresist layer with the second thickness overlies the boundary of the drain;

defining the protective layer using the photoresist layer as a mask to expose a portion of the drain;

removing the photoresist layer with the second thickness to leave the protective layer overlying the boundary of the drain;

depositing a transparent conductive layer on the substrate, overlying the protective layer overlying the boundary of the drain, electrically connected to the exposed drain; and removing the remaining photoresist layer and the transparent conductive layer formed thereon to form a pixel electrode.

2. The method as claimed in claim 1, wherein formation of the active device comprises:
   forming a gate on the substrate;
   forming an insulation layer on the substrate, overlying the gate;
   forming a patterned semiconductor layer on the insulation layer; and
   forming a source and a drain on the patterned semiconductor layer at both sides of the gate.

3. The method as claimed in claim 2, wherein formation of the gate comprises:
   forming a first metal layer on the substrate; and
   patterning the first metal layer to form the gate.

4. The method as claimed in claim 2, wherein formation of the patterned semiconductor layer, the source and the drain comprises:
   forming a semiconductor layer on the insulation layer;
   forming a second metal layer on the semiconductor layer; and
   defining the semiconductor layer and the second metal layer using a half-tone or gray-tone mask to form the patterned semiconductor layer, the source and the drain.

5. The method as claimed in claim 2, further comprising forming a capacitor on the substrate.

6. The method as claimed in claim 5, wherein formation of the capacitor on the substrate comprises:
   forming a first metal line on the substrate;
   forming the insulation layer on the first metal line;
   forming a second metal line having a boundary on the insulation layer;
   forming the protective layer on the second metal line;
   defining the protective layer overlying the second metal line using a half-tone or gray-tone mask to leave the protective layer overlying the boundary of the second metal line, exposing a portion of the second metal line; and
   forming the pixel electrode on the protective layer overlying the boundary of the second metal line, electrically connected to the exposed second metal line.

7. The method as claimed in claim 6, wherein definition of the protective layer overlying the second metal line using a half-tone or gray-tone mask comprises:
   forming another photoresist layer having a third thickness and a fourth thickness on the protective layer overlying the second metal line, wherein the third thickness exceeds the fourth thickness and the another photoresist layer with the fourth thickness overlies the boundary of the second metal line;
   defining the protective layer using the another photoresist layer as a mask to expose a portion of the second metal line;
   removing the other photoresist layer with the fourth thickness to leave the protective layer overlying the boundary of the second metal line;
   depositing the transparent conductive layer on the remaining another photoresist layer, overlying the protective layer overlying the boundary of the second metal line, electrically connected to the exposed second metal line; and
   removing the remaining another photoresist layer and the transparent conductive layer formed thereon.

8. The method as claimed in claim 6, wherein the first metal line is simultaneously formed with the gate.

9. The method as claimed in claim 6, wherein the first metal line comprises gate line or common line.

10. The method as claimed in claim 6, wherein the second metal line is simultaneously formed with the source and the drain.

11. The method as claimed in claim 6, wherein formation of the capacitor on the substrate further comprises forming the patterned semiconductor layer between the insulation layer and the second metal line.

12. The method as claimed in claim 5, wherein formation of the capacitor on the substrate comprises:
    forming a first metal line having a boundary on the substrate;
    forming the insulation layer on the first metal line;
    forming the protective layer on the insulation layer to cover the boundary of the first metal line; and
    depositing the pixel electrode on the protective layer.

13. The method as claimed in claim 12, wherein the first metal line comprises gate line or common line.

* * * * *